(12) United States Patent
Callegari et al.

(10) Patent No.: US 6,770,500 B2
(45) Date of Patent: Aug. 3, 2004

(54) PROCESS OF PASSIVATING A METAL-GATED COMPLEMENTARY METAL OXIDE SEMICONDUCTOR

(75) Inventors: Alessandro Cesare Callegari, Yorktown Heights, NY (US); Christopher P. D'emic, Ossining, NY (US); Hyungjun Kim, Fishkill, NY (US); Fenton Read McFeely, Ossining, NY (US); Vijay Narayanan, New York, NY (US); John Jacob Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/099,004

(22) Filed: Mar. 15, 2002

(65) Prior Publication Data

US 2003/0186518 A1 Oct. 2, 2003

(51) Int. Cl.$^7$ ................................................ H01L 21/00
(52) U.S. Cl. ........................ 438/38; 438/199; 438/528; 438/565
(58) Field of Search .......................... 438/38, 199, 202, 438/528, 542, 565, 773, 279, 288

(56) References Cited

U.S. PATENT DOCUMENTS 5,789,312 A * 8/1998 Buchanan et al. .......... 438/585

6,410,456 B1 * 6/2002 Gronet et al. ............... 438/769
2002/0076886 A1 * 6/2002 Rotondaro et al.

OTHER PUBLICATIONS

K.L. Brower, "Passivation of Paramagnetic SI–SIO Interface States with Molecular Hydrogen"; Appl. Phys. Lett., 53 (6) p. 508–510 (1988).

K.L. Brower, "Dissociation Kinetics of Hydrogen–Passivated (111) SI–SIO Interface Defects"; U.S. Government, 42 (6) p. 3444–3456 (1990).

H. Shang et al., "Interface Studies of Tungstan Gate Metal–Oxide–Silicon Capacitors"Appl. Phys. Lett., 78 (20) p. 3139–3141 (2001).

A. Stesmans et al., "Hydrogen–Induced Thermal Interface Degradation in (111) Si/Sio Revealed by Electron–Spin Resonance"; Appl. Phys. Lett., 72 (18) p. 2271–2273.

* cited by examiner

Primary Examiner—W. David Coleman
Assistant Examiner—Khiem Nguyen
(74) Attorney, Agent, or Firm—Scully, Scott, Murphy & Presser; Robert M. Trepp

(57) ABSTRACT

A process of passivating a metal-gated CMOS structure in which a metal-gated CMOS structure is passivated in an atmosphere of molecular hydrogen at a temperature of between about 250° C. and about 500° C. and a pressure of at least about 200 Torr. The present process provides a lower interface state density than obtainable by prior art passivation processes.

20 Claims, 2 Drawing Sheets

PROCESS OF PASSIVATING A METAL-GATED COMPLEMENTARY METAL OXIDE SEMICONDUCTOR

BACKGROUND OF THE DISCLOSURE

1. Field of the Invention

The present invention is directed to a process of passivating a metal-gated complementary metal oxide semiconductor (CMOS) by lowering the interface state density between the silicon substrate and the dielectric of the metal-gated CMOS structure and reducing the fixed charge in the dielectric. More preferably, the present invention is directed to a process of passivating a metal-gated CMOS by exposing that CMOS to an atmosphere of molecular hydrogen at an elevated temperature higher than room temperature.

2. Background of the Prior Art

Passivation of CMOS structures, in the prior art, when polysilicon-gated CMOS structures were predominant, was typically conducted by exposing the CMOS structure to forming gas (FG) annealing. Such passivation resulted in a density of interface states (Dit) less than $5e10/cm^2$-eV. Although passivation of polysilicon-gated CMOS structures is presently successfully practiced using FG annealing, this method has been demonstrated to be inadequate when the CMOS structure is a metal-gated CMOS, specifically when tungsten is the metal gate.

Metal-gated CMOS structures have not yet been fully commercialized and are still in the exploratory phase. However, metal-gated structures are expected to be utilized in the future. Thus, there is a strong need in the art for an effective process of passivation of metal-gated CMOS structures. Those skilled in the art are aware that metal-gated CMOS structures may employ a single mid-gap metal, e.g., tungsten, or a dual metal option with a suitable nfet metal, such as aluminum, titanium, tantalum nitride or alloys thereof, or a pfet metal, e.g. rhenium or rhodium.

FG annealing of CMOS structures performed after deposition of tungsten metal at temperatures between 350 to 550° C. does not result in a low enough Dit. Insofar as passivation of the dielectric/silicon interface by FG anneals occurs prior to tungsten metal deposition, depassivation of the CMOS structure occurs during deposition. In addition, passivation by FG annealing may result in an increase in dielectric thickness, due to the formation of interfacial silica. Insofar as thickness of the CMOS structure is critical to conform with scaling targets, this thickness increase of up to about five angstroms evidences yet another reason for the need of a new process for the passivation of metal-gated CMOS structures.

The above remarks are supported by quantitative data. The prior art anneal passivation technique of FG annealing produces Dit values for a typical metal-gated CMOS structure in which the gate dielectric is silica and the gate conductor is tungsten of more than $1e11/cm^2$-eV. This Dit is much too high for effective use of the CMOS. There is also some evidence that some of the gate metals currently being contemplated for use in metal-gated CMOS structures specifically for the dual metal option, are thermally unstable beyond 500° C., thus necessitating a low temperature postmetal passivation process.

A recent passivation process has been developed for metal-gated CMOS structure. That process, utilized in a tungsten-gated silica structure, is disclosed in a commonly assigned U.S. patent application Ser. No. 09/760,621, filed Jan. 16, 2001, which produces Dit's in the range of about $3e10/cm^2$-eV. This passivation process employs hydrogen plasma.

Hydrogen plasma is employed because it results in the formation of atomic hydrogen which passivates the dielectric/silicon interface. However, the presence of a plasma complicates the process by making it expensive and ill well suited to batch processing. In addition, hydrogen plasma may have a detrimental effect upon the gate electrode or other parts of the CMOS structure. That is, the plasma may damage the gate electrode or other parts of the CMOS structure due to the production of reactive atomic hydrogen. Thus, the copending application, although representing a very significant advance in the art, still does not fully solve the problems associated with passivation of metal-gated CMOS structures.

The above remarks suggest the criteria necessary for a successful passivation process for newly developed metal-gated CMOS structures. First, the passivation process must result in a Dit of less than about $5e10/cm^2$-eV at the dielectric/silicon interface. Second, the passivation technique must be performed at a relatively low temperature, specifically <400° C. Third, the process should tolerate an air break between gate metal deposition and passivation. Fourth, the process should not involve highly reactive species which may damage different parts of the CMOS structure. Fifth, the process should utilize low cost and easy to maintain equipment. Sixth, the process should be suitable for batch processing (i.e. multiple wafers).

Passivation performed using a hydrogen plasma would not satisfy criteria four through six, highlighting a significant drawback of this technique.

BRIEF SUMMARY OF THE INVENTION

A new process for passivation of metal-gated CMOS structures has now been discovered which satisfies all the criteria described in the previous section. The new process may be implemented by two related procedures. Procedure 1 includes the steps of disposing a metal-gated CMOS structure in a chamber; removing the ambient air from chamber by evacuating that chamber to provide a high vacuum of $10^{-5}$ Torr; introducing molecular hydrogen into the chamber so that hydrogen is present in a concentration such that the pressure in the chamber is at least about 200 Torr; concurrently heating the metal-gated CMOS structure to a temperature in the range of between about 250° C. and about 500° C.; cooling the CMOS structure in hydrogen; and removing the CMOS under ambient conditions. Procedure 2 includes the steps of disposing a metal-gated CMOS structure in a chamber; removing the ambient air from chamber by purging with an inert gas, such as nitrogen or argon, at atmospheric pressure or slightly above atmospheric pressure to reduce the partial pressure of ambient air. Specifically, oxygen, in the ambient air, is reduced to a concentration of less than about 20 parts per million (ppm); introducing molecular hydrogen into the chamber at atmospheric pressure so that the partial pressure of hydrogen is at least about 200 Torr; concurrently heating the metal-gated CMOS structure to a temperature in the range of between about 250° C. and about 500° C.; and removing the CMOS under ambient conditions.

BRIEF DESCRIPTION OF THE DRAWINGS

The present invention will be better understood by reference to the accompanying drawings of which.

DETAILED DESCRIPTION

Figure 1:
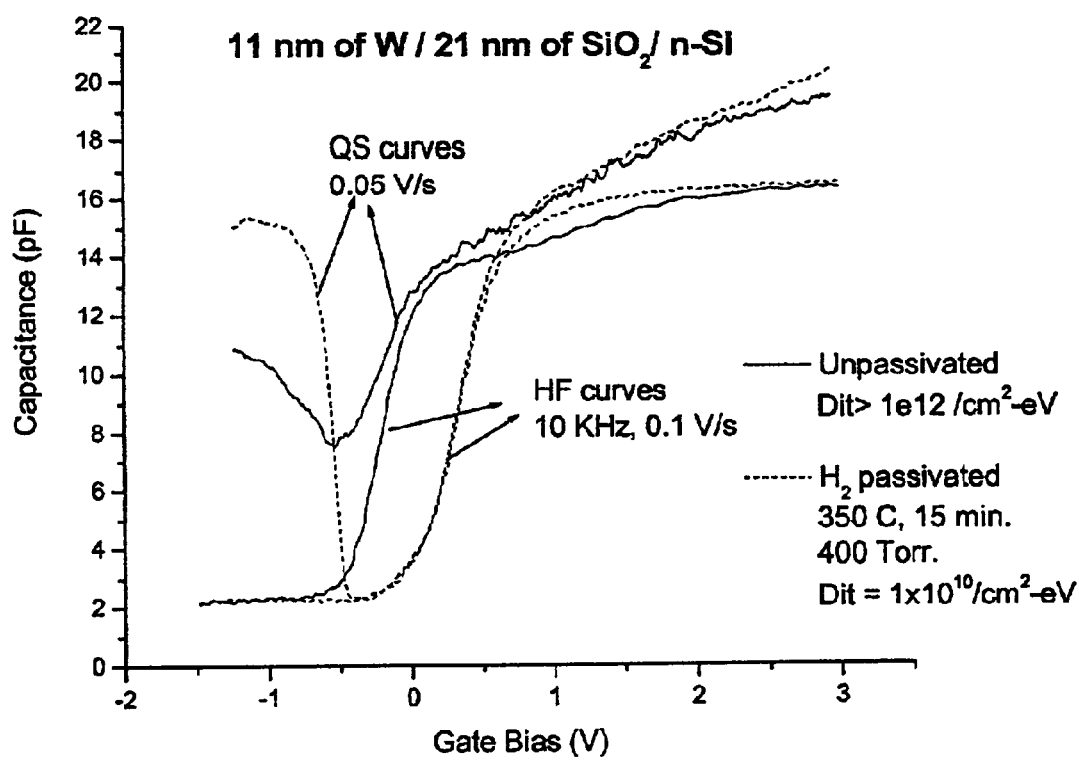
FIG. 1 is a graphical representation of capacitance as a function of gate bias voltage for a tungsten-gated CMOS structure.
Figure 2:
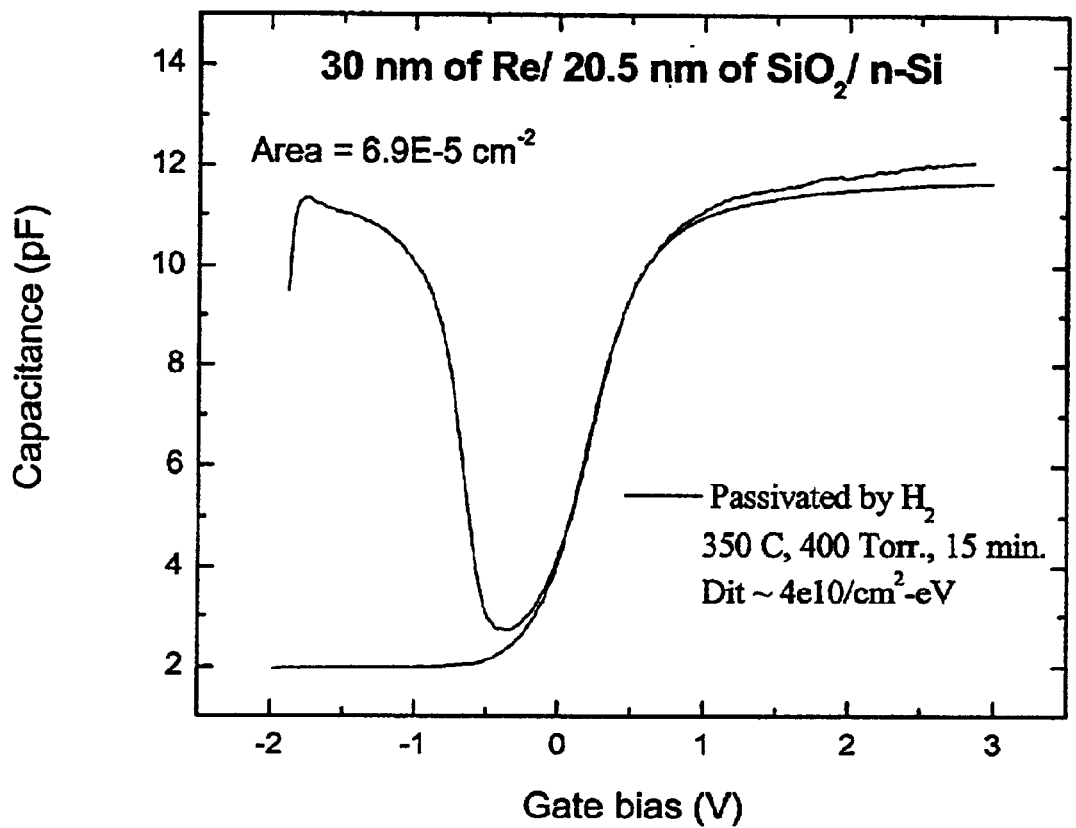
FIG. 2 is a graphical representation of capacitance as a function of gate bias voltage for a rhenium-gated CMOS structure.

The passivation process of the present invention is directed to passivating a metal-gated CMOS structure by techniques compatible with obtaining a metal-gated CMOS meeting the requirements that that electrical device must meet in service. Specifically, the passivation process of the present invention provides passivation of metal-gated CMOS structures in which the gate conductor is selected from the group consisting of tungsten, rhenium, aluminum, cobalt, tantalum, titanium, ruthenium, iridium, platinum, zirconium and niobium. Preferably, the gate electrode is either a single mid-gap metal, prominently illustrated by tungsten, a dual metal-gated CMOS structure utilizing a suitable nfet metal, such as aluminum, titanium, tantalum nitride or an alloy containing aluminum, titanium or tantalum, or a pfet metal, such as rhenium or rhodium.

The gate dielectric of the metal-gated CMOS may be an oxide or nitride of silicon, cerium, aluminum, hafnium, zirconium, yttrium, lanthanum, barium, strontium, titanium, tantalum, niobium, lithium, lead and magnesium. Preferably, the gate dielectric is silica, silicon nitride, alumina, zirconia or hafnia. Still more preferably, the gate dielectric is silica or silicon nitride. Most preferably, the gate dielectric is silica.

Using procedure 1, the aforementioned metal-gated CMOS structure is disposed in a standard load lock chamber. Load lock chambers, well known in the art, are used in chemical vapor deposition of metals employed in the fabrication of metal-gated CMOS structures. Thereupon the load lock chamber is evacuated to produce a high vacuum. Preferably, the load lock chamber is evacuated to $10^{-3}$ Torr. More preferably, the load lock chamber pressure is $10^{-4}$ Torr. Still more preferably, the vacuum in the chamber is $10^{-5}$ Torr. Molecular hydrogen is introduced into the evacuated load lock chamber through a leak valve and is feed into the chamber until a pressure of at least about 200 Torr is reached. More preferably, the pressure in the load lock chamber, provided by the molecular hydrogen, is at least about 300 Torr. Still more preferably, the hydrogen pressure in the load lock chamber is at least about 400 torr.

Simultaneously with the increase in pressure in the load lock chamber, provided by the introduction of molecular hydrogen, the metal-gated CMOS structure is heated to a temperature in the range of between about 250° C. and about 500° C. Preferably, the temperature of the metal-gated CMOS structure is increased to a range of between about 325° C. and about 400° C. More preferably, the temperature of the metal-gated CMOS structure in the load lock chamber is maintained at about 350° C.

In a preferred embodiment heating is provided by a halogen lamp, and the chamber walls are maintained at temperatures less than or equal to about 70° C.

The metal-gated CMOS is preferably exposed to the aforementioned thermodynamic conditions for a period in the range of between about 15 minutes and about 45 minutes. More preferably, the metal-gated CMOS is passivated for a period of about 30 minutes. Of course, processing time is optimized for the specific gated-metal CMOS stack undergoing passivation.

The load lock chamber is thereupon purged and the metal-gated CMOS structure removed under ambient conditions. In a preferred embodiment, purging is provided by the steps of first reducing the temperature of the substrate to no more than about 200° C. More preferably, the temperature is reduced to a temperature of no more that about 100° C. At this reduced temperature the chamber is re-evacuated to provide a vacuum of the same magnitude as that originally present prior to the introduction of the molecular hydrogen. That is, the pressure in the load lock chamber is reduced to at least about $10^{-3}$ Torr, more preferably about $10^{-4}$ Torr and most preferably, about $10^{-5}$ Torr. Thereupon an inert gas is introduced into the chamber to increase the pressure to atmospheric. In a preferred embodiment the inert gas is neon, argon or nitrogen. Of these, nitrogen or argon is more preferred. Most preferably, the inert gas is nitrogen. When the atmospheric pressure is reached, the load lock chamber is opened and the stack of passivated metal-gated CMOS structure is removed.

Using procedure 2, the metal-gated CMOS structure is disposed in a chamber with a tube within a tube design. A flat quartz flange fits over the inner tube to separate the inner and outer tube gases. Nitrogen flows in the outer tube at a rate of at least about 20 liters/min to help reduce the amount of oxygen to less than 2 ppm. The metal-gated CMOS structures are loaded with the inner tube pulled out of the chamber at room temperature. The inner tube is purged with nitrogen at atmospheric pressure for at least 30 minutes at room temperature prior to loading the metal-gated CMOS structure into the chamber, to reduce oxygen in the inner tube to less than 2 ppm.

Preferably the inner tube is purged with nitrogen at atmospheric pressure for at least 1 hour at room temperature prior to loading the metal-gated CMOS structure into the chamber. The metal-gated CMOS structure is then disposed in the inner tube and the tube is loaded into the chamber.

The metal-gated CMOS structures undergo a stabilization period in nitrogen for at least about forty minutes as the temperature of the metal-gated CMOS structures is increased to a range of between about 250° C. to about 500° C. Preferably, the temperature of the metal-gated CMOS structure is increased to a range between about 325° C. and about 400° C. More preferably, the temperature of the metal-gated CMOS structure in the load lock chamber is maintained at about 350° C. Molecular hydrogen is then introduced into the inner tube at atmospheric pressure at about 10 liters/min and the metal-gated CMOS is exposed to these conditions for a period in the range between about 15 minutes and about 45 minutes. Processing time is optimized for the specific gated-metal CMOS stack undergoing passivation. Following exposure to hydrogen, nitrogen is introduced into the inner chamber for at least about 15 minutes to purge out the hydrogen gas. The inner tube is unloaded from the chamber at about 350° C. in flowing nitrogen. Once out of the chamber, the metal-gated CMOS structures are cooled to no more than about 200° C. in nitrogen while still inside the inner quartz tube. The metal-gated CMOS structure is then taken out of the inner tube under ambient conditions.

The following examples are given to illustrate the present invention. Since these examples are given for illustrative purposes only, the invention should not be deemed limited thereto.

EXAMPLE 1

Passivation of a Tungsten-Gated CMOS

A metal-gated CMOS which included a 10 nanometric (nm) thick tungsten gate conductor and a 21 nm silica gate dielectric was disposed in a load lock chamber. The chamber was evacuated to about $10^{-5}$ Torr and thereupon hydrogen gas was introduced therein. At the same time as hydrogen gas was introduced into the chamber, the metal-gated CMOS structure was heated by halogen lamp heaters to a temperature of 350° C. When the pressure in the chamber reached 400 Torr, further introduction of molecular hydrogen ceased.

The chamber was maintained at these thermodynamic conditions for 15 minutes. Thereupon the chamber was cooled to 100° C. in the presence of molecular hydrogen and again evacuated. Nitrogen gas was introduced into the chamber to bring the pressure up to atmospheric and the CMOS structure was removed from the chamber.

The CMOS structure removed from the chamber was tested to determine its interface state density and was found to have a Dit of $1e10/cm^2$-eV. This value was determined by a combination of quasistatic (QS, 50 mV/s) and high frequency (HF, 10 kHz) capacitance-voltage (C-V) curves using the well known Hi-Lo method (S. M. Sze, Physics of Semiconductor Devices, Chapter 7, Wiley and Sons).

EXAMPLE 2

Comparative Testing of Tungsten-Gated CMOS's

A metal-gated CMOS, identical to the CMOS passivated in accordance to the procedure of Example 1, was subjected to a HF test performed at 10 kHz and the results of this test appear in FIG. 1 and are compared with a metal-gated CMOS which has not undergone passivation.

The CMOS structure, subjected to passivation as set forth in Example 1, was next subjected to QS testing which again measured capacitance as a function of gate bias voltage. The results of this test also appear in FIG. 1, along with the results of an identical metal-gated CMOS, also subjected to quasistatic testing, but which was not passivated. HF and QS measurements were performed in the standard manner.

EXAMPLE 3

Passivation of Rhenium-Gated CMOS

A metal-gated CMOS having a 30 nm thick rhenium gate conductor and a 20.5 nm thick silica gate dielectric was passivated in exact accordance with the procedure described in Example 1.

The thus passivated rhenium-gated CMOS was found to have a Dit of about $4e10/cm^2$-eV, when tested in accordance with the same test utilized in Example 1.

DISCUSSION OF RESULTS

The advance in the art provided by the passivation process of the present invention is most dramatically evidenced by the reduction in Dit, when comparing passivated and non-passivated identical tungsten-gated CMOS structures. The Dit value of $1e10/cm^2$-eV evidenced a fully passivated capacitor structure without the formation of any interfacial oxide. Decrease in Dit's was evidenced by a decrease in the minima of the QS curve relative to the minima of the HF curve.

In the high frequency and quasistatic capacitance-voltage measurements of tungsten-gated CMOS structures, the large flat band shift, after hydrogen passivation, evidenced reduction in fixed charge within the gate dielectric compared to the unpassivated CMOS.

Identical rhenium-gated CMOS structures passivated in accordance with the present invention showed Dits ~4e10/ $cm^2$-eV demonstrating that the passivation process can successfully passivate a rhenium-gated CMOS structure as per criterion stated before.

The above embodiments and examples are given to illustrate the scope and spirit of the present invention. These embodiments and examples will make apparent, to those skilled in the art, other embodiments and examples. These other embodiments and examples are within the contemplation of the present invention. Therefore, the present invention should be limited only by the appended claims.

What is claimed is:

1. A process of passivating a metal-gated CMOS structure comprising:
   disposing a metal-gated CMOS in a chamber;
   evacuating ambient air from said chamber;
   introducing molecular hydrogen into said evacuated chamber to provide a hydrogen pressure of at least 200 Torr;
   sequentially heating metal-gated CMOS structure in said chamber to a temperature in the range of between about 250° C. and about 500° C.;
   cooling said chamber to a temperature of no more than about 200° C.;
   purging said chamber; and
   removing said metal-gated CMOS structure from said chamber, wherein said passivating of said metal-gated CMOS structure results in a density of interface states of less than about $1e11/cm^2$-eV at a dielectric substrate interface.

2. A process in accordance with claim 1 wherein said step of evacuating ambient air from said chamber comprises evacuating said chamber to provide a vacuum wherein said pressure is no more than about $10^{-3}$ Torr.

3. A process in accordance with claim 2 wherein said chamber is evacuated in a pressure of no more than about $10^{-4}$ Torr.

4. A process in accordance with claim 1 wherein said step of evacuating ambient air from said chamber comprising purging said chamber with an inert gas at about atmospheric pressure wherein oxygen in said ambient air is present in a concentration of less than about 20 ppm.

5. A process in accordance with claim 4 wherein said inert gas is nitrogen or argon and wherein said oxygen in said ambient air is presently in a concentration of less than about 2 ppm.

6. A process in accordance with claim 1 wherein said molecular hydrogen introduced into said chamber provides a partial pressure of at least about 300 Torr.

7. A process in accordance with claim 6 wherein said molecular hydrogen introduced into said chamber provides a partial pressure of at least about 400 Torr.

8. A process in accordance with claim 1 wherein metal-gated CMOS structure in said chamber is heated to a temperature of between about 325° C. and about 400° C.

9. A process in accordance with claim 1 wherein metal-gated CMOS structure in said chamber is cooled to a temperature of no more than about 100° C.

10. A process in accordance with claim 1 wherein said purging step comprises evacuating said chamber to a pressure of no more than about $10^{-3}$ Torr and thereafter introducing an inert gas into said chamber to raise the pressure in said chamber to about atmospheric.

11. A process in accordance with claim 1 wherein said purging step comprises evacuating said chamber to a pressure of about $10^{-4}$ Torr and thereafter introducing a gas selected from the group consisting of nitrogen, neon and argon to raise the pressure in said chamber to about atmospheric.

12. A process in accordance with claim 1 wherein said metal-gated CMOS includes a gate dielectric selected from the group consisting of an oxide or nitride of silicon, aluminum, hafnium, zirconium, yttrium, lanthanum, barium, strontium, titanium, tantalum, niobium, lithium, lead and magnesium.

13. A process in accordance with claim 12 wherein said gate dielectric is selected from the group consisting of silica, silicon nitride, alumina, zirconia and hafnia.

14. A process in accordance with claim 13 wherein said metal-gated CMOS structure includes a gate conductor of a material selected from the group consisting of tungsten, rhenium, aluminum, cobalt, tantalum, titanium, ruthenium, rhodium, iridium, platinum, zirconium and niobium.

15. A process in accordance with claim 1 wherein said metal-gated CMOS structure is a nfet including a gate conductor of a material selected from the group consisting of aluminum, titanium, tantalum and alloys thereof or a pfet including a gate conductor of a material selected from the group consisting of rhenium and rhodium.

16. A process in accordance with claim 1 wherein said chamber is a load lock chamber.

17. A process of passivating a metal-gated CMOS structure comprising the steps of:

disposing a metal-gated CMOS structure in a load lock chamber;

evacuating said load lock chamber to provide a vacuum of at least about $10^{31\ 4}$ Torr;

introducing molecular hydrogen into said load lock chamber to provide a pressure of at least about 300 Torr;

sequentially heating said metal-gated CMOS structure in said chamber to a temperature in the range of between about 325° C. and about 400° C.;

cooling said metal-gated CMOS structure in said chamber to a temperature of no more than about 200° C.;

evacuating said chamber to a pressure of no more than about $10^{31\ 4}$ Torr;

introducing an inert gas selected from the group consisting of nitrogen and argon into said chamber whereby said chamber pressure is raised to about atmospheric; and removing said metal-gated CMOS structure from said load lock chamber, wherein said passivating of said metal-fated CMOS structure results in a density of interface states of less than about $1e11/cm^2$-eV at a dielectric substrate interface.

18. A process in accordance with claim 17 wherein said metal-gated CMOS structure gate dielectric is silica and said gate conductor is tungsten.

19. A process of passivating a metal-gated CMOS structure comprising steps of:

disposing a metal-gated CMOS structure in a chamber;

removing ambient air from said chamber by purging with an inert gas at or slightly above atmospheric pressure whereby oxygen in said ambient air is present in a concentration of less than about 2 ppm;

introducing molecular hydrogen into said chamber to provide a partial pressure of hydrogen of at least about 300 Torr;

sequentially, heating said metal-gated CMOS structure in said chamber to a temperature in the range of between about 325° C. and about 400° C.;

cooling said metal-gated CMOS structure in said chamber to a temperature of no more than about 200° C.;

purging said chamber with an inert gas selected from the group consisting of nitrogen and argon; and removing said metal-gated CMOS structure from said chamber, wherein said passivating of said metal-gated CMOS structure results in a density of interface states of less than about $1e11/cm^2$-eV at a dielectric substrate interface.

20. A process in accordance with claim 19 wherein said metal-gated CMOS structure gate dielectric is silica and said gate conductor is tungsten.

* * * * *